United States Patent
Fukuda et al.

(10) Patent No.: US 8,570,117 B2
(45) Date of Patent: Oct. 29, 2013

(54) BIAS CIRCUIT

(75) Inventors: Atsushi Fukuda, Yokosuka (JP); Hiroshi Okazaki, Zushi (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 432 days.

(21) Appl. No.: 12/898,164

(22) Filed: Oct. 5, 2010

(65) Prior Publication Data

US 2011/0080230 A1    Apr. 7, 2011

(30) Foreign Application Priority Data

Oct. 7, 2009  (JP) ................................. 2009-233570

(51) Int. Cl.
*H03H 7/01* (2006.01)
(52) U.S. Cl.
USPC ......................................... 333/181; 327/552
(58) Field of Classification Search
USPC ............ 323/205–211; 327/538–543; 333/181
See application file for complete search history.

(56) References Cited

U.S. PATENT DOCUMENTS

| 5,089,790 | A | 2/1992 | Mochizuki et al. |
| 6,326,849 | B1 | 12/2001 | Wang et al. |
| 7,385,450 | B2 | 6/2008 | Fukuda et al. |
| 7,501,914 | B2 | 3/2009 | Shimomura et al. |
| 7,532,075 | B2 | 5/2009 | Fukuda et al. |
| 7,656,249 | B2 | 2/2010 | Fukuda et al. |
| 7,710,217 | B2 | 5/2010 | Fukuda et al. |
| 2002/0027475 | A1 | 3/2002 | Belot et al. |
| 2003/0227330 | A1 | 12/2003 | Khanifar et al. |
| 2006/0087374 | A1 | 4/2006 | Khanifar et al. |
| 2008/0094142 | A1* | 4/2008 | Kawashima et al. ......... 330/296 |

FOREIGN PATENT DOCUMENTS

| CN | 101166014 A | 4/2008 |
| GB | 2 236 028 A | 3/1991 |
| JP | 8-32366 | 2/1996 |
| JP | 8-204472 | 8/1996 |

(Continued)

OTHER PUBLICATIONS

Koji Uchida, et al. "Dual-band Power SiMOSFET Amplifier with Two-section Impedance Transformers." IEICE General Conference, C-2-39. 2004. p. 74.

(Continued)

*Primary Examiner* — Benny Lee
*Assistant Examiner* — Rakesh Patel
(74) *Attorney, Agent, or Firm* — Oblon, Spivak, McClelland, Maier & Neustadt, L.L.P.

(57) ABSTRACT

A bias circuit includes: a bias supply terminal 800; a parallel capacitor 3 connected at one end thereof to the bias supply terminal 800 and grounded at the other end thereof; and a parallel circuit 3L connected in parallel with the parallel capacitor 3 and connected at one end thereof to the bias supply terminal 800. Let 2≤N. The parallel circuit 3L includes: a direct-current power supply connection terminal 600; N parallel inductors $2_1$ to $2_N$ connected in series with each other between the bias supply terminal 800 and the direct-current power supply connection terminal 600; and N−1 series resonators $9_1$ to $9_{N-1}$. Each series resonator $9_1$ to $9_{N-1}$ includes: a resonant capacitor $7_1$ to $7_{N-1}$ connected at one end thereof to a connecting point between adjacent parallel inductors; and a resonant inductor $8_1$ to $8_{N-1}$ connected at one end thereof to the other end of the resonant capacitor $7_1$ to $7_{N-1}$ and grounded at the other end thereof.

3 Claims, 8 Drawing Sheets

(56) References Cited

FOREIGN PATENT DOCUMENTS

| | | |
|---|---|---|
| JP | 9-289421 | 11/1997 |
| JP | 2004-32366 | 1/2004 |
| JP | 2006-254378 | 9/2006 |
| JP | 2008-136182 | 6/2008 |
| JP | 2008-160192 | 7/2008 |
| JP | 2008-283430 | 11/2008 |
| WO | WO 2005/107063 A1 | 11/2005 |

OTHER PUBLICATIONS

Koji Uchida, et al. "Dual-band Power SiMOSFET Amplifier with Two-section Impedance Transformers." Proceedings of the 2004 IEICE General Conference, C-2-39, Mar. 22, 25, 2004, 4 pages (reference previously filed, submitting English translation and its cover page only).

Koji Uchida, et al. "Dual-band GaAs FET Power Amplifier With Two-Frequency Matching Circuits", IEEE, APMC2005 Proceedings, 2005, 4 pages.

The Extended European Search Report issued Jun. 16, 2011, in Application No. / Patent No. 10186639.0-1233/2309642.

Japanese Office Action issued May 15, 2012 in Patent Application No. 2009-233570 with English Translation.

Combined Chinese Office Action and Search Report issued Apr. 17, 2013, in Chinese Patent Application No. 201010299067.1 with English translation.

\* cited by examiner

BIAS CIRCUIT

TECHNICAL FIELD

The present invention relates to a bias circuit used in an amplifier or the like.

BACKGROUND ART

An active device such as transistors requires a direct-current (DC) power for operation. A bias circuit is used to supply the DC power to the active device while isolating transmission paths of an alternating-current (AC) signal from a DC power supply.

For example, in an amplifier, an amplification device outputs the amplified AC signal at an output terminal. The main energy of the amplified signal comes from the DC power supply. That is, the amplifier converts the energy received from the DC power supply to that of the AC signal. The bias circuit serves to pass the energy from the DC power supply to the amplification device. In order not to affect the transmission of the AC signal, the bias circuit has a filtering function for preventing the AC signal from flowing into the bias circuit.

FIG. 1 shows an exemplary configuration of a conventional bias circuit 900 that supplies a DC voltage to an active device (FET) 180. A bias supply terminal 800 of the bias circuit 900 is connected to a line between an AC signal source 1 and the active device 180 (between a port A and a port B). The bias circuit 900 includes a parallel resonant circuit 78p with a capacitor 7 having a capacitance $C_1$ and an inductor 8 having an inductance $L_1$ connected in parallel with each other. One end of the parallel resonant circuit 78p corresponds to the bias supply terminal 800 and the other end of the parallel resonant circuit 78p corresponds to a terminal 600 where a DC circuit part 10 with a DC circuit 5, such as a choke coil, and a DC power supply 6 is connected. The DC power supply 6 generates a certain DC voltage with respect to the ground potential. A capacitor 4 having a sufficiently-large capacitance and grounded at one end thereof is connected to the terminal 600. The energy of the DC power supply 6 is supplied to the active device 180 via the terminal 600 and the bias supply terminal 800.

The resonance frequency of the parallel resonant circuit 78p denoted by a character f is determined by the capacitance $C_1$ and the inductance $L_1$. At the resonance frequency f, the impedance of the bias circuit 900 as viewed from the bias supply terminal 800 toward the DC power supply 6 is considered infinite, so that no AC signal enters the bias circuit. In other words, the bias circuit 900 is a bias circuit that operates at the resonance frequency f. In general, the filtering function of the resonant circuit of the conventional bias circuit 900 or the like is effective only in the proximity of the resonant frequency.

However, recently, there is an increasing demand for radio frequency (RF) circuits capable of multiband operation. The amplifier is an essential component of the RF circuits. That is, the amplifier also is desired to operate in multiple bands. Several methods for enabling multiband operation of the amplifier have been proposed. One example is an amplifier capable of simultaneously amplifying signals in two inherent frequency bands (see "Dual-band Power SiMOSFET Amplifier with Two-section Impedance Transformers", Uchida et al., 2004 IEICE General Conference, C-2-39, referred to as Non-Patent literature 1 hereinafter). The multi-band amplifier can be applied to a system capable of high-speed transmission using a plurality of frequency bands, such as spectrum aggregation. To supply energy from a DC power supply to such a multiband amplifier, the bias circuit itself has to operate in multiple bands. This means that the conventional bias circuit 900 is difficult to apply to the multiband amplifier. Thus, the multi-band amplifier disclosed in Non-Patent literature 1 has a bias circuit that comprises a parallel resonant circuit and a transmission line Q having an effect similar to that of the parallel resonant circuit connected in series with each other. This bias circuit is designed in such a manner that the resonance frequency of the parallel resonant circuit is a first frequency and the transmission line Q is a quarter-wave line that is short-circuited at the tip at a second frequency. Therefore, this bias circuit can supply energy of a DC power supply to the multiband amplifier simultaneously at two different frequency bands. However, it is difficult for the bias circuit configured in this way to supply energy of the DC power supply to the multiband amplifier simultaneously at three or more different frequency bands.

Another known bias circuit capable of multiband operation is a bias circuit disclosed in Japanese Patent Application Laid-Open No. 2006-254378. This bias circuit supplies energy of a DC power supply separately for a plurality of frequency bands by switching and cannot supply energy from a DC power supply simultaneously for a plurality of frequency bands.

SUMMARY OF THE INVENTION

In view of such circumstances, an object of the present invention is to provide a bias circuit that has high design flexibility and can supply a DC voltage and/or a direct current to an active device simultaneously for a plurality of frequency bands.

To attain the object, a bias circuit according to the present invention is configured as described below. That is, the bias circuit comprises: a bias supply terminal for supplying a DC voltage and/or a direct current to an active device; a capacitor (a parallel capacitor) connected at one end thereof to the bias supply terminal and grounded at the other end thereof; and a parallel circuit connected in parallel with the parallel capacitor and connected at one end thereof to the bias supply terminal. Let N denote a predetermined integer equal to or greater than 2, q denote each integer equal to or greater than 2 and equal to or smaller than N−1, and m denote each integer equal to or greater than 1 and equal to or smaller than N−1. The parallel circuit comprises: a DC power supply connection terminal connected to a DC circuit part including a DC power supply; N inductors (parallel inductors) connected in series with each other; and N−1 series resonators, wherein a first parallel inductor of the N parallel inductors is connected at one end thereof to the bias supply terminal, a q-th parallel inductor of the N parallel inductors is connected at one end thereof to the other end of a (q−1)-th parallel inductor of the N parallel inductors and connected at the other end thereof to one end of a (q+1)-th parallel inductor of the N parallel inductors, an N-th parallel inductor of the N parallel inductors is connected at the other end thereof to the DC power supply connection terminal, and an m-th series resonator of the N−1 series resonators includes an m-th capacitor (a resonant capacitor) and an m-th inductor (a resonant inductor) and is connected at one end thereof to a connecting point between an m-th parallel inductor of the N parallel inductors and an (m+1)-th parallel inductor of the N parallel inductors and grounded at the other end thereof.

EFFECTS OF THE INVENTION

According to the present invention, as described later with regard to specific embodiments, a series resonator in a bias circuit has an impedance of zero at the resonance frequency of the series resonator. Thus, at the frequency, a short circuit state (a short-circuited state from the viewpoint of an AC signal) occurs at a connecting point (between parallel inductors) to which the series resonator is connected. As a result, at the frequency, the bias circuit is effectively equivalent to an arrangement comprising a parallel capacitor, and one or more parallel inductors and one or more series resonators that exist between the short-circuited connecting point and a bias supply terminal. This holds true for each of the series resonators in the bias circuit. Therefore, when the reactance of each component in the bias circuit is appropriately set so that the impedance of the bias circuit as viewed from the bias supply terminal toward the bias circuit is infinite (that is, the admittance is zero) at each resonance frequency, a DC voltage and/or a direct current can be supplied to an active device simultaneously for a plurality of frequency bands without a switching operation or the like. In addition, since the impedance of the series resonator to a direct current is infinite, no direct current flows through the series resonator. Thus, there are less design constraints on the inductors included in series resonators in particular, and the bias circuit is easy to design. In addition, since many of the components of the bias circuit may be lumped elements, the bias circuit can have a smaller size.

DETAILED DESCRIPTION OF THE EMBODIMENTS

Figure 1:
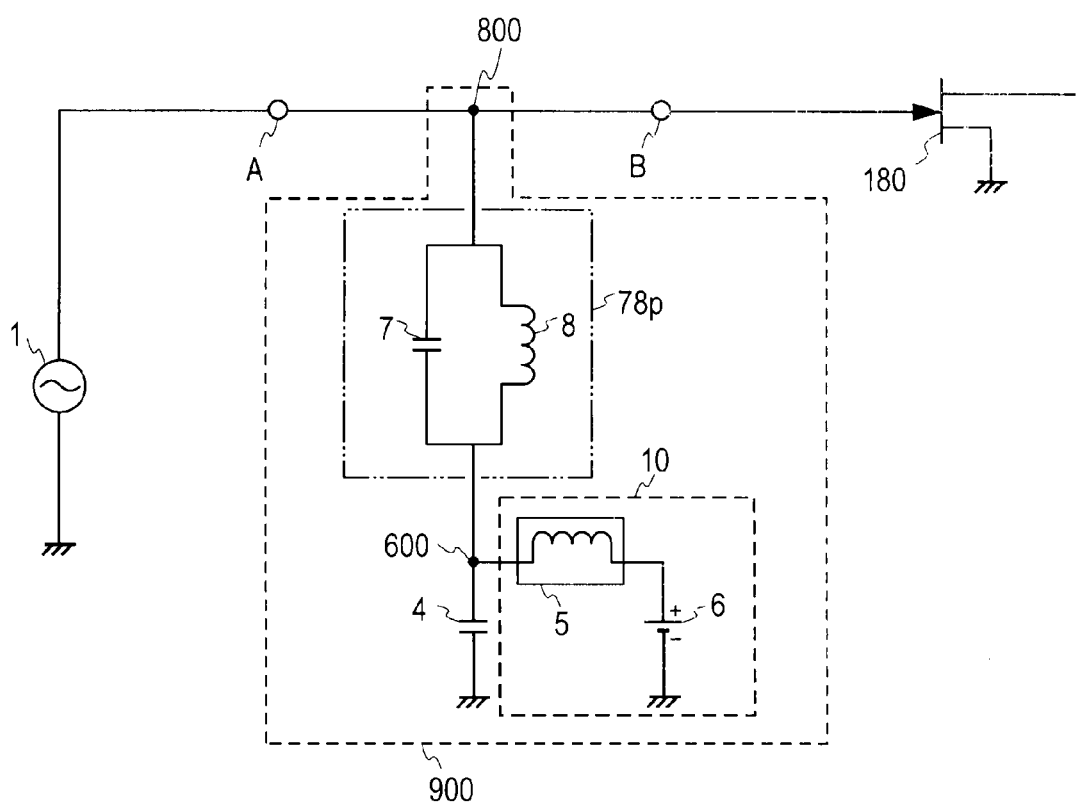
FIG. 1 is a block diagram showing an exemplary configuration of a conventional bias circuit.

Embodiments of the present invention will be described with reference to the drawings. Throughout the drawings, the same components are denoted by the same reference numerals, and redundant descriptions thereof will be omitted.

Figure 2:
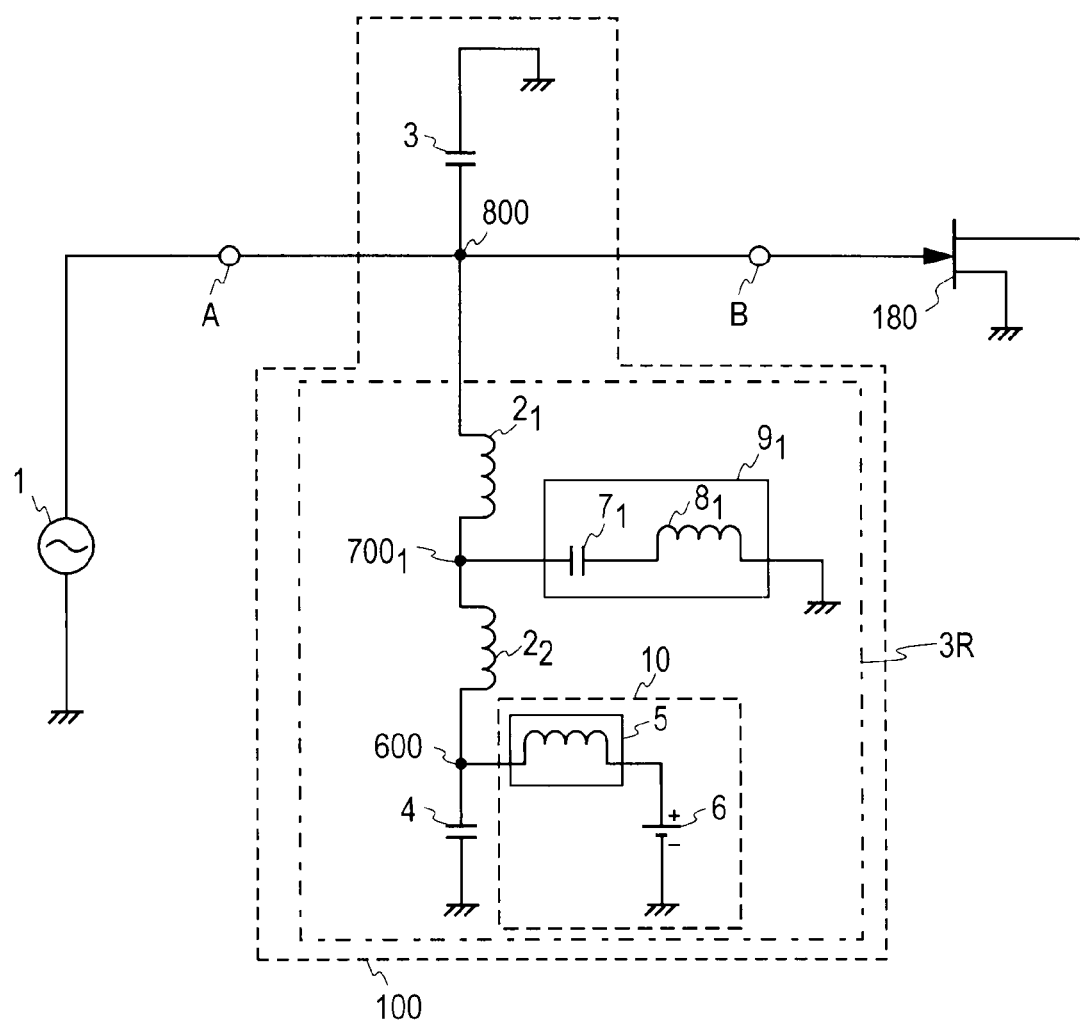
FIG. 2 is a block diagram showing a bias circuit (designed for dual-band operation) according to an embodiment of the present invention.

To help understanding the present invention, FIG. 2 shows a bias circuit 100 according to an embodiment of the present invention that can supply a DC voltage and/or a direct current from a DC power supply 6 to an active device 180 simultaneously for two different frequency bands $f_1$ and $f_2$. In this embodiment, the bias circuit 100 is used on the input terminal side of an amplifier.

A bias supply terminal 800 of the bias circuit 100 is connected to a line between an AC signal source 1 and an active device 180 (between a port A and a port B).

The active device 180 may be a transistor, a field effect transistor (FET), a metal oxide semiconductor FET (MOSFET), a thin film transistor (TFT), or the like. Although the active device 180 shown in the drawings is an n-channel junction FET, the n-channel junction FET is only an example of the active device 180, and the present invention is not limited to the n-channel junction FET.

The bias circuit 100 includes: a capacitor 3 having a capacitance $C_p$, grounded at one end thereof and connected at the other end thereof to the bias supply terminal 800 (referred to as a parallel capacitor hereinafter); and a parallel circuit 3R connected in parallel with the parallel capacitor 3 and connected at one end thereof to the bias supply terminal 800. The parallel circuit 3R includes: an inductor $2_1$ having an inductance $L_{p1}$ and connected at one end thereof to the bias supply terminal 800 (referred to as a first parallel inductor hereinafter); an inductor $2_2$ having an inductance $L_{p2}$ and connected at one end thereof to the other end of the first parallel inductor $2_1$ and connected at the other end thereof to a DC power supply connection terminal 600 (referred to as a second parallel inductor hereinafter); a first series resonator $9_1$ connected at one end thereof to a connecting point $700_1$ between the first parallel inductor $2_1$ and the second parallel inductor $2_2$; a capacitor 4 having a capacitance C and connected at one end thereof to the DC power supply connection terminal 600 and grounded at the other end thereof (referred to as a grounding capacitor hereinafter); and a DC circuit part 10 connected to the DC power supply connection terminal 600. The first series resonator $9_1$ includes: a capacitor $7_1$ having a capacitance $C_{s1}$ and connected at one end thereof to the connecting point $700_1$ (referred to as a first resonant capacitor hereinafter); and an inductor $8_1$ having an inductance $L_{s1}$ and connected at one end thereof to the other end of the capacitor $7_1$ and grounded at the other end thereof (referred to as a first resonant inductor hereinafter). The DC circuit part 10 includes: a DC circuit 5, such as a choke coil, connected at one end thereof to the DC power supply connection terminal 600; and a DC power supply 6 that is connected to the other end of the DC circuit 5 and generates a certain DC voltage with respect to the ground potential. The energy from the DC power supply 6 is supplied to the active device 180 via the bias supply terminal 800.

The grounding capacitor 4 has a sufficiently-large capacitance C, and the impedance of the grounding capacitor 4 is substantially zero (a short circuit state) in any desired frequency bands.

A resonance frequency of the first series resonator $9_1$ is referred to as a first frequency $f_1$. The first frequency $f_1$, an inductance $L_{s1}$ and the capacitance $C_{s1}$ are related according to the following formula (1).

$$f_1 = \frac{1}{2\pi\sqrt{L_{s1}C_{s1}}} \quad (1)$$

At the first frequency $f_1$, the impedance of the first series resonator $9_1$ as viewed from the connecting point $700_1$ toward the first series resonator $9_1$ is zero (a short circuit state). Thus, when the bias circuit 100 is viewed from the bias supply terminal 800, the short circuit state always occurs at the connecting point $700_1$ regardless of what circuit is connected between the connecting point $700_1$ and the DC power supply connection terminal 600. Therefore, at the first frequency $f_1$, the impedance of the bias circuit 100 as viewed from the bias supply terminal 800 toward the bias circuit 100 is determined by the parallel capacitor 3 and the first parallel inductor $2_1$.

At the first frequency $f_1$, a combined admittance $Y_{p1}$ of the parallel capacitor 3 and the first parallel inductor $2_1$ is expressed by the following formula (2). In this formula, $\omega_x$ denotes an angular frequency of an x-th frequency $f_x$ ($\omega_x = 2\pi f_x$).

$$Y_{p1} = \left( j\omega_1 C_p + \frac{1}{j\omega_1 L_{p1}} \right) \quad (2)$$

According to the following formula (3), the inductance $L_{p1}$ of the first parallel inductor $2_1$ associated with the capacitance $C_p$ of the parallel capacitor 3 is determined so that the combined admittance $Y_{p1}$ is zero.

$$L_{p1} = \frac{1}{(2\pi f_1)^2 C_p} \quad (3)$$

Since the combined admittance $Y_{p1}$ of the parallel capacitor 3 and the first parallel inductor $2_1$ is 0, or in other words, a combined impedance $Z_{p1}$ of the parallel capacitor 3 and the first parallel inductor $2_1$ is infinite, the impedance of the bias circuit 100 as viewed from the bias supply terminal 800 toward the bias circuit 100 is infinite, so that the bias circuit 100 has no effect on the signal at the first frequency $f_1$.

Next, at a second frequency $f_2$ different from the first frequency $f_1$, the short circuit state does not occur at the connecting point $700_1$, and the inductance $L_{p2}$ of the second parallel inductor is set so that a combined impedance of the parallel capacitor 3, the first parallel inductor $2_1$, the first series resonator $9_1$ and the second parallel inductor $2_2$ is infinite.

Here the inductance $L_{s1}$ and the capacitance $C_{s1}$ are set under the condition of the formula (1) so that the impedance of the first series resonator $9_1$ at the second frequency $f_2$ is sufficiently large, or in other words, the admittance of the first series resonator $9_1$ is substantially zero from the standpoint of the AC signal at the second frequency $f_2$. Thus, a combined admittance $Y_{p2}$ of the bias circuit 100 (in this case, a combined admittance of the parallel capacitor 3, the first parallel inductor $2_1$, the first series resonator $9_1$ and the second parallel inductor $2_2$) at the second frequency $f_2$ can be expressed by the following approximate formula (4).

$$Y_{p2} \approx \left( j\omega_2 C_p + \frac{1}{j\omega_2 (L_{p1} + L_{p2})} \right) \quad (4)$$

Accordingly, the inductance $L_{p2}$ of the second parallel inductor $2_2$ is determined according to the following formula (5) so that the combined admittance $Y_{p2}$ is zero.

$$L_{p2} = \frac{1}{(2\pi f_2)^2 C_p} - L_{p1} \quad (5)$$

Since a combined impedance $Z_{p2}$ of the parallel capacitor 3, the first parallel inductor $2_1$ and the second parallel inductor $2_2$ at the second frequency $f_2$ is infinite, the impedance of the bias circuit 100 as viewed from the bias supply terminal 800 toward the bias circuit 100 is infinite, and thus, the bias circuit 100 have no effect on the signal at the second frequency $f_2$. Therefore, the DC voltage and/or the direct current from the DC power supply 6 are simultaneously supplied to the active device 180 without affecting the transmission characteristics of the AC signals at the desired two frequencies $f_1$ and $f_2$.

As can be seen from the formulas (3) and (5), in design, the frequencies are preferably related according to $f_1 > f_2$.

An impedance $Z_{s12}$ of the first series resonator $9_1$ at the second frequency $f_2$ is expressed by the following formula (6).

$$Z_{s12} = \left( j\omega_2 L_{s1} + \frac{1}{j\omega_2 C_{s1}} \right) = \frac{1 - \frac{\omega_2^2}{\omega_1^2}}{j\omega_2 C_{s1}} \quad (6)$$

As can be seen from the formula (6), the impedance $Z_{s12}$ increases as the capacitance $C_{s1}$ of the first resonant capacitor $7_1$ decreases. On the other hand, as can be seen from the formula (1), if the capacitance $C_{s1}$ decreases, the inductance $L_{s1}$ of the first resonant inductor $8_1$ has to be increased. Typically, the inductor is formed by a winding. Therefore, if the inductance is increased while maintaining the allowable current of the wire, the size of the inductor increases, and the parasitic capacitance also increases accordingly, so that the desired inductance may not be able to be achieved in a high frequency band. Thus, it is difficult to design a useful inductor that combines a high inductance and a high allowable current. The bias circuit according to the present invention is also expected to handle a high direct current when the bias circuit is applied to a power amplifier. However, since the impedance of the first series resonator $9_1$ to a DC is infinite as shown by the formula (6), no direct current flows into the first resonant inductor $8_1$. Therefore, an inductor having a low allowable current can be used as a resonant inductor in the first series resonator $9_1$. That is, for the bias circuit according to the present invention, it is not difficult to design the capacitor in the series resonator to have a low capacitance and the inductor in the series resonator to have a high inductance, and as a result, the impedance at frequencies other than the resonance frequency of the series resonator can be designed to be high. Thus, the bias circuit can be easily designed.

In addition, as can be seen from the formulas (3) and (5), the inductance $L_{p1}$ of the first parallel inductor $2_1$ and the inductance $L_{p2}$ of the second parallel inductor $2_2$ can be decreased by appropriately setting the capacitance $C_p$ of the parallel capacitor 3. More specifically, for the bias circuit according to the present invention, the inductance of each parallel inductor can be easily decreased by increasing the capacitance $C_p$ of the parallel capacitor 3. Thus, the bias circuit can be easily designed and reduced in size.

Figure 3:
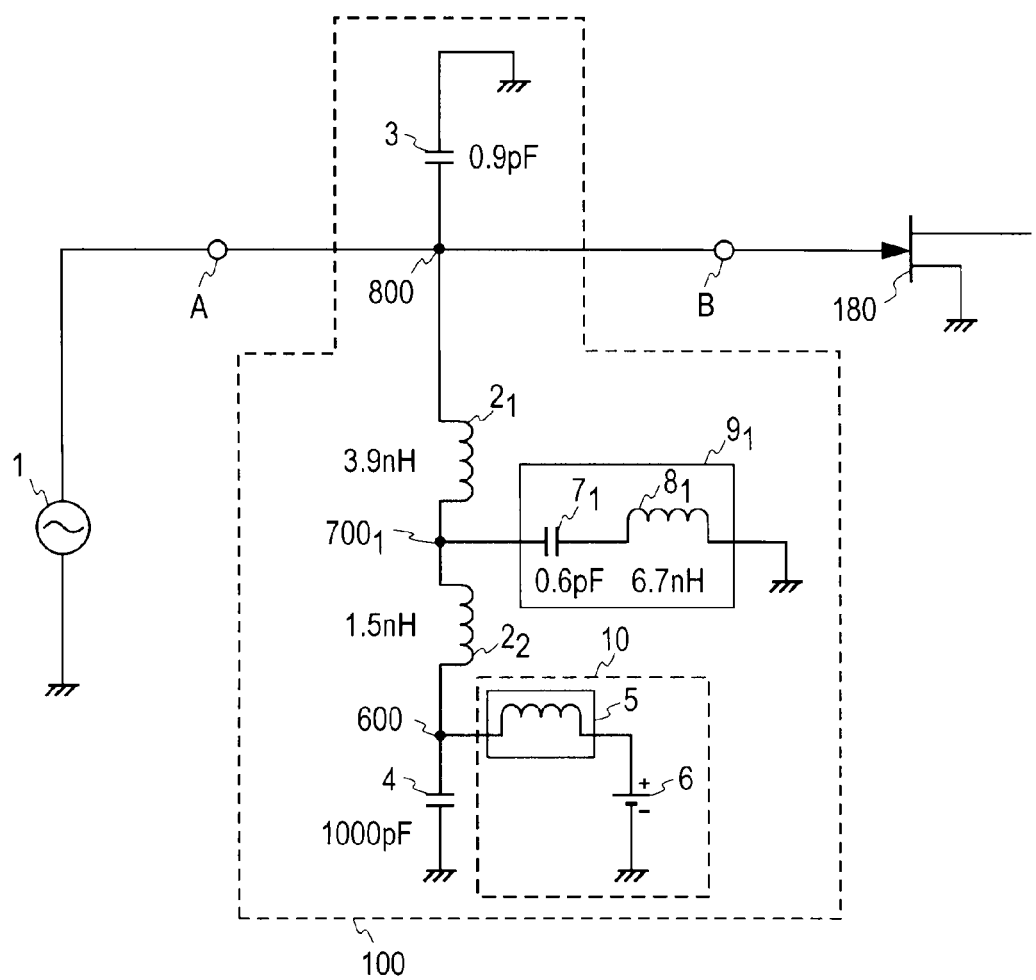
FIG. 3 is a diagram showing a specific example of the bias circuit designed for dual-band operation according to the embodiment in which a first frequency $f_1$=2.5 GHz, and a second frequency $f_2$=2 GHz.
Figure 4:
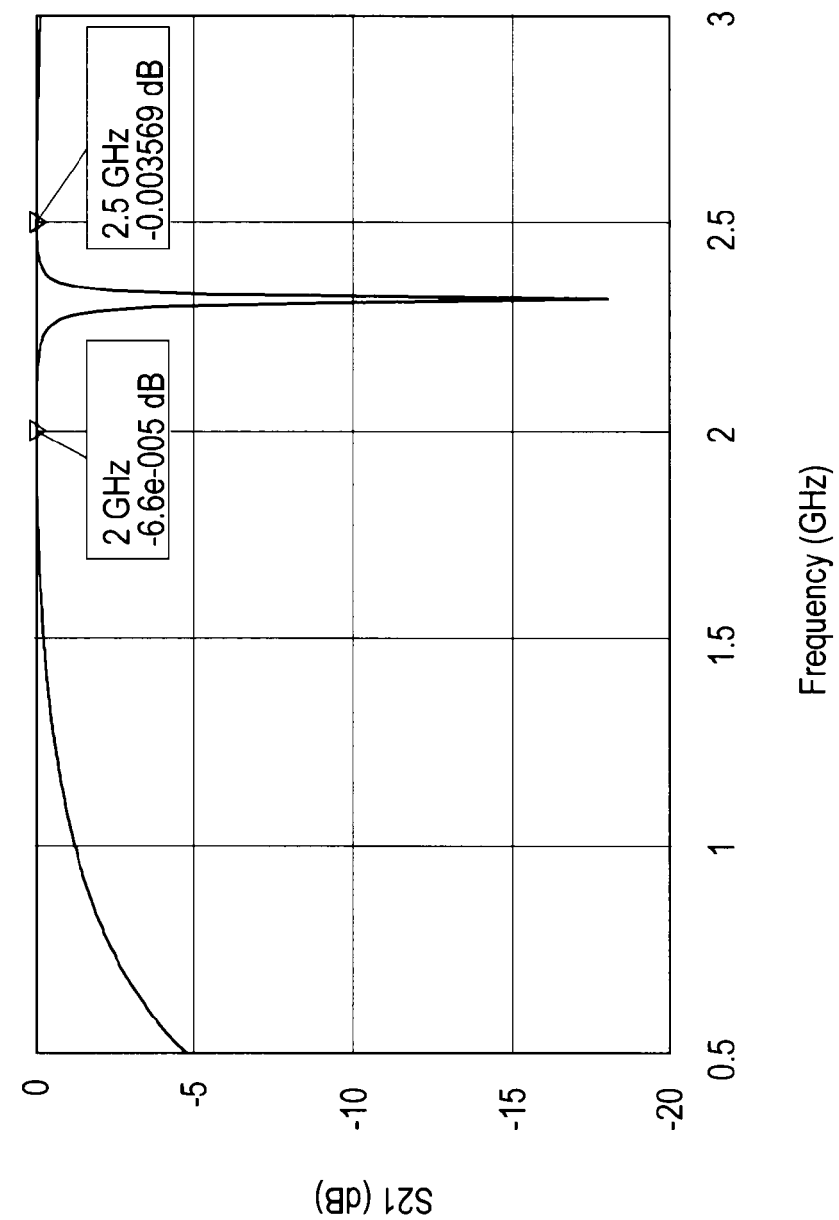
FIG. 4 is a graph showing a result of simulation of pass characteristics (S21) at the first frequency $f_1$ and the second frequency $f_2$ of the bias circuit designed for dual-band operation according to the embodiment shown in FIG. 3.

FIG. 3 shows a circuit including the bias circuit 100 designed on the condition that $f_1 = 2.5$ GHz, and $f_2 = 2$ GHz ($C_p = 0.9$ pF, $L_{p1} = 3.9$ nH, $L_{p2} = 1.5$ nH, $C = 1000$ pF, $C_{s1} = 0.6$ pF, $L_{s1} = 6.7$ nH). FIG. 4 shows pass characteristics (S21) of an AC signal from the port A to the port B in the bias circuit shown in FIG. 3. As can be seen from the drawing, the loss is extremely low at each frequency, and the bias circuit 100 has substantially no effect on the AC signal.

Figure 5:
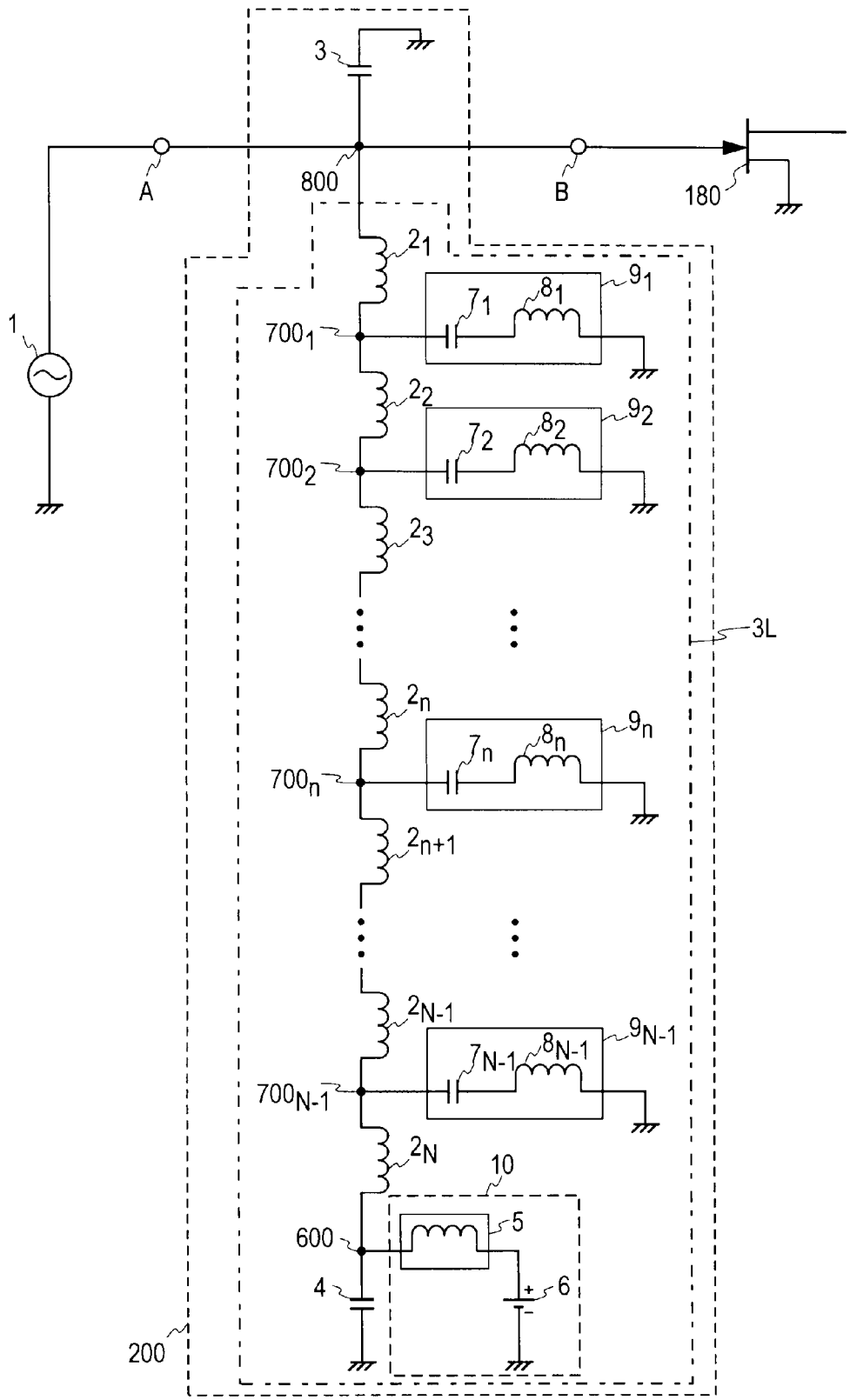
FIG. 5 is a block diagram showing a bias circuit (designed for N bands) according to an embodiment of the present invention.

The bias circuit 100 described above can supply a DC voltage and/or a direct current to an active device simultaneously for two different frequency bands. Next, there will be described a bias circuit 200 according to another embodiment that can supply a DC voltage and/or a direct current to an active device simultaneously for N different frequency bands $f_1, f_2, \ldots, f_N$ (N denotes a predetermined integer equal to or greater than 2) (see FIG. 5). That is, the bias circuit 100 is the bias circuit 200 in the case of N=2.

The bias circuit 200 includes: a parallel capacitor 3 having a capacitance $C_p$ and grounded at one end thereof and connected at the other end thereof to a bias supply terminal 800; and a parallel circuit 3L connected in parallel with the parallel capacitor 3 and connected at one end thereof to the bias supply terminal 800. The parallel circuit 3L includes: a first parallel inductor $2_1$ having an inductance $L_{p(1)}$ connected at one end thereof to the bias supply terminal 800; a q-th parallel inductor $2_q$ having an inductance $L_{p(q)}$ and connected at one end thereof to the other end of a (q−1)-th parallel inductor $2_{q-1}$ and connected at the other end thereof to one end of a (q+1)-th parallel inductor $2_{q+1}$ where q denotes each integer equal to or greater than 2 and equal to or smaller than N−1; an N-th parallel inductor $2_N$ having an inductance $L_{p(N)}$ and connected at one end thereof to the other end of an (N−1)-th parallel inductor $2_{N-1}$ and connected at the other end thereof to a DC power supply connection terminal 600; an m-th series resonator $9_m$ connected at one end thereof to a connecting point $700_m$ between an m-th parallel inductor $2_m$ and an (m+1)-th parallel inductor $2_{m+1}$ where m denotes each integer equal to or greater than 1 and equal to or smaller than N−1; a grounding capacitor 4 having a capacitance C and connected at one end thereof to the DC power supply connection terminal 600 and grounded at the other end thereof; and a DC circuit part 10 connected to the DC power supply connection terminal 600. The m-th series resonator $9_m$ includes: an m-th resonant capacitor $7_m$ having a capacitance $C_{sm}$ and connected at one end thereof to the connecting point $700_m$; and an m-th resonant inductor $8_m$ having an inductance $L_{sm}$ and connected at one end thereof to the other end of the m-th resonant capacitor $7_m$ and grounded at the other end thereof. The DC circuit part 10 includes: a DC circuit 5, such as a choke coil, connected at one end thereof to the DC power supply connection terminal 600; and a DC power supply 6 that is connected to the other end of the DC circuit 5 and generates a certain DC voltage with respect to the ground potential. The energy of the DC power supply 6 is supplied to an active device 180 via the bias supply terminal 800.

It is supposed that n denotes each integer equal to or greater than 2 and equal to or smaller than N, and a resonance frequency of an (n−1)-th series resonator $9_{n-1}$ is referred to as an (n−1)-th frequency $f_{n-1}$.

The frequency $f_{n-1}$, the inductance $L_{s(n-1)}$, and the capacitance $C_{s(n-1)}$ are related to each other according to the following formula (7).

$$f_{n-1} = \frac{1}{2\pi\sqrt{L_{s(n-1)}C_{s(n-1)}}} \tag{7}$$

[1] In the case where n is 2, the inductances of the first parallel inductor $2_1$ and the second parallel inductor $2_2$ can be determined in the same way as for the bias circuit 100 described above.

[2] In the case where n is an integer equal to or greater than 3 and equal to or smaller than N, although a short circuit state does not occur at the connecting points $700_1$ to $700_{n-2}$, the impedance of the (n−1)-th series resonator $9_{n-1}$ as viewed from the connecting point $700_{n-1}$ toward the (n−1)-th series resonator $9_{n-1}$ is zero (a short circuit state) at the (n−1)-th frequency $f_{n-1}$. Thus, when the bias circuit 200 is viewed from the bias supply terminal 800, the short circuit state always occurs at the connecting point $700_{n-1}$ regardless of what circuit is connected between the connecting point $700_{n-1}$ and the DC power supply connection terminal 600. Therefore, at the (n−1)-th frequency $f_{n-1}$, the inductance $L_{p(n-1)}$ of the (n−1)-th parallel inductor $2_{n-1}$ is determined so that the impedance of the bias circuit 200 as viewed from the bias supply terminal 800 toward the bias circuit 200 (a combined impedance of the parallel capacitor 3, the first to the (n−1)-th parallel inductors $2_1$ to $2_{n-1}$, and the first to the (n−2)-th series resonators $9_1$ to $9_{n-2}$) is infinite. When the impedance of each of the first to the (n−2)-th series resonators $9_1$ to $9_{n-2}$ at the (n−1)-th frequency $f_{n-1}$ is sufficiently large, or in other words, when the admittance of each of the first to the (n−2)-th series resonators $9_1$ to $9_{n-2}$ is substantially zero from the standpoint of the AC signal at the (n−1)-th frequency $f_{n-1}$, a combined admittance $Y_{p(n-1)}$ of the bias circuit (in this case, a combined admittance of the parallel capacitor 3, the first to the (n−1)-th parallel inductors $2_1$ to $2_{n-1}$, and the first to the (n−2)-th series resonators $9_1$ to $9_{n-2}$) at the (n−1)-th frequency $f_{n-1}$ is expressed by the following approximate formula (8).

$$Y_{p(n-1)} \approx \left( j\omega_{(n-1)}C_p + \frac{1}{j\omega_{(n-1)}(L_{p1} + \ldots + L_{p(n-1)})} \right) \tag{8}$$

Accordingly, the inductance $L_{p(n-1)}$ is determined according to the following formula (9) so that the combined admittance $Y_{p(N-1)}$ is zero.

$$L_{p(n-1)} = \frac{1}{(2\pi f_{(n-1)})^2 C_p} - (L_{p1} + \ldots + L_{p(n-2)}) \tag{9}$$

Since the combined admittance $Y_{p(n-1)}$ of the parallel capacitor 3 and the first to the (n−1)-th parallel inductors $2_1$ to $2_{n-1}$ at the (n−1)-th frequency $f_{n-1}$ is 0, or in other words, a combined impedance $Z_{p(n-1)}$ of the parallel capacitor 3 and the first to the (n−1)-th parallel inductors $2_1$ to $2_{n-1}$ is infinite, the impedance of the bias circuit 200 as viewed from the bias supply terminal 800 toward the bias circuit 200 is infinite, and thus, the bias circuit 200 have no effect on the signal at the (n−1)-th frequency $f_{n-1}$.

At the N-th frequency $f_N$, a short circuit state does not occur at the connecting points $700_1$ to $700_{N-1}$, and the inductance $L_{pN}$ of the N-th parallel inductor $2_N$ is determined so that the combined impedance of the parallel capacitor 3, the first to N-th parallel inductors $2_1$ to $2_N$ and the first to the (N−1)-th series resonators $9_1$ to $9_{N-1}$ is infinite at the N-th frequency $f_N$.

When the impedance of each of the first to the (N−1)-th series resonators $9_1$ to $9_{N-1}$ at the N-th frequency $f_N$ is sufficiently large, or in other words, when the admittance of each of the first to the (N−1)-th series resonators $9_1$ to $9_{N-1}$ is substantially zero from the standpoint of the AC signal at the N-th frequency $f_N$, a combined admittance $Y_{pN}$ of the bias circuit (in this case, a combined admittance of the parallel capacitor 3, the first to N-th parallel inductors $2_1$ to $2_N$ and the first to the (N−1)-th series resonators $9_1$ to $9_{N-1}$) at the N-th frequency $f_N$ is expressed by the following approximate formula (10).

$$Y_{pN} \approx \left( j\omega_N C_p + \frac{1}{j\omega_N (L_{p1} + \ldots + L_{pN})} \right) \quad (10)$$

Accordingly, the inductance $L_{pN}$ of the N-th parallel inductor $2_N$ is determined according to the following formula (11) so that the combined admittance $Y_{pN}$ is zero.

$$L_{pN} = \frac{1}{(2\pi f_N)^2 C_p} - (L_{p1} + \ldots + L_{p(N-1)}) \quad (11)$$

Since the combined admittance $Y_{pN}$ of the parallel capacitor 3 and the first to the N-th parallel inductors $2_1$ to $2_N$ at the N-th frequency $f_N$ is 0, or in other words, a combined impedance $Z_{pN}$ of the parallel capacitor 3 and the first to the N-th parallel inductors $2_1$ to $2_N$ is infinite, the impedance of the bias circuit 200 as viewed from the bias supply terminal 800 toward the bias circuit 200 is infinite, and thus, the bias circuit 200 have no effect on the signal at the N-th frequency $f_N$.

As can be seen from the formulas (9) and (11), the bias circuit 200 is preferably designed so that $f_1 > f_2 > \ldots > f_{N-1} > f_N$. In this case, when the capacitance of each resonant capacitor and the inductance of each resonant inductor are determined so that the impedance of each of the first to the (n−2)-th series resonators $9_1$ to $9_{n-2}$ is sufficiently large (the admittance of each of the series resonators $9_1$ to $9_{n-2}$ is substantially zero) at the (n−1)-th frequency $f_{n-1}$, the impedance of each of the first to the (n−2)-th series resonators $9_1$ to $9_{n-2}$ is also sufficiently large (the admittance of each of the series resonators $9_1$ to $9_{n-2}$ is substantially zero) at the n-th frequency $f_n$. This is because the impedance of a resonant capacitor is inversely proportional to the frequency. Therefore, at the n-th frequency $f_n$, the capacitance of the resonant capacitor of the (n−1)-th series resonator $9_{n-1}$ and the inductance of the resonant inductor of the (n−1)-th series resonator $9_{n-1}$ can be determined so that the impedance of the (n−1)-th series resonator $9_{n-1}$ is sufficiently large (the admittance of the (n-1)-th series resonator $9_{n-1}$ is substantially zero).

An impedance $Z_{sny}$ of an n-th series resonator $9_n$ at the y-th frequency $f_y$ ($n<y\leq N$) is expressed by the following formula (12).

$$Z_{sny} = \left( j\omega_y L_{sn} + \frac{1}{j\omega_y C_{sn}} \right) = \frac{1 - \frac{\omega_y^2}{\omega_n^2}}{j\omega_y C_{sn}} \quad (12)$$

As can be seen from the formula (12), the impedance $Z_{sny}$ increases as a capacitance $C_{sn}$ of an n-th resonant capacitor $7_n$ decreases. On the other hand, as can be seen from the formula (7), if the capacitance $C_{sn}$ decreases, an inductance $L_{sn}$ of an n-th resonant inductor $8_n$ has to be increased. However, since the impedance of the n-th series resonator $9_n$ to a direct current is infinite as described above, no direct current flows into the n-th resonant inductor $8_n$. Therefore, an inductor having a low allowable current can be used as a resonant inductor in the n-th series resonator $9_n$. That is, in designing the bias circuit capable of simultaneous biasing for N different frequencies according to the present invention, it is not difficult to design the capacitors in the series resonators to have low capacitances and the inductors in the series resonators to have high inductances, and as a result, the impedance at frequencies other than the resonance frequencies of the series resonators can be designed to be high. Thus, the bias circuit can be easily designed.

In addition, as can be seen from the formulas (3), (5), (9) and (11), the inductance of each of the first to the N-th parallel inductors $2_1$ to $2_N$ can be decreased by appropriately setting the capacitance $C_p$ of the parallel capacitor 3. More specifically, for the bias circuit according to the present invention, the inductance of each parallel inductor can be easily decreased by increasing the capacitance $C_p$ of the parallel capacitor 3. Thus, the bias circuit can be easily designed and reduced in size.

Figure 6:
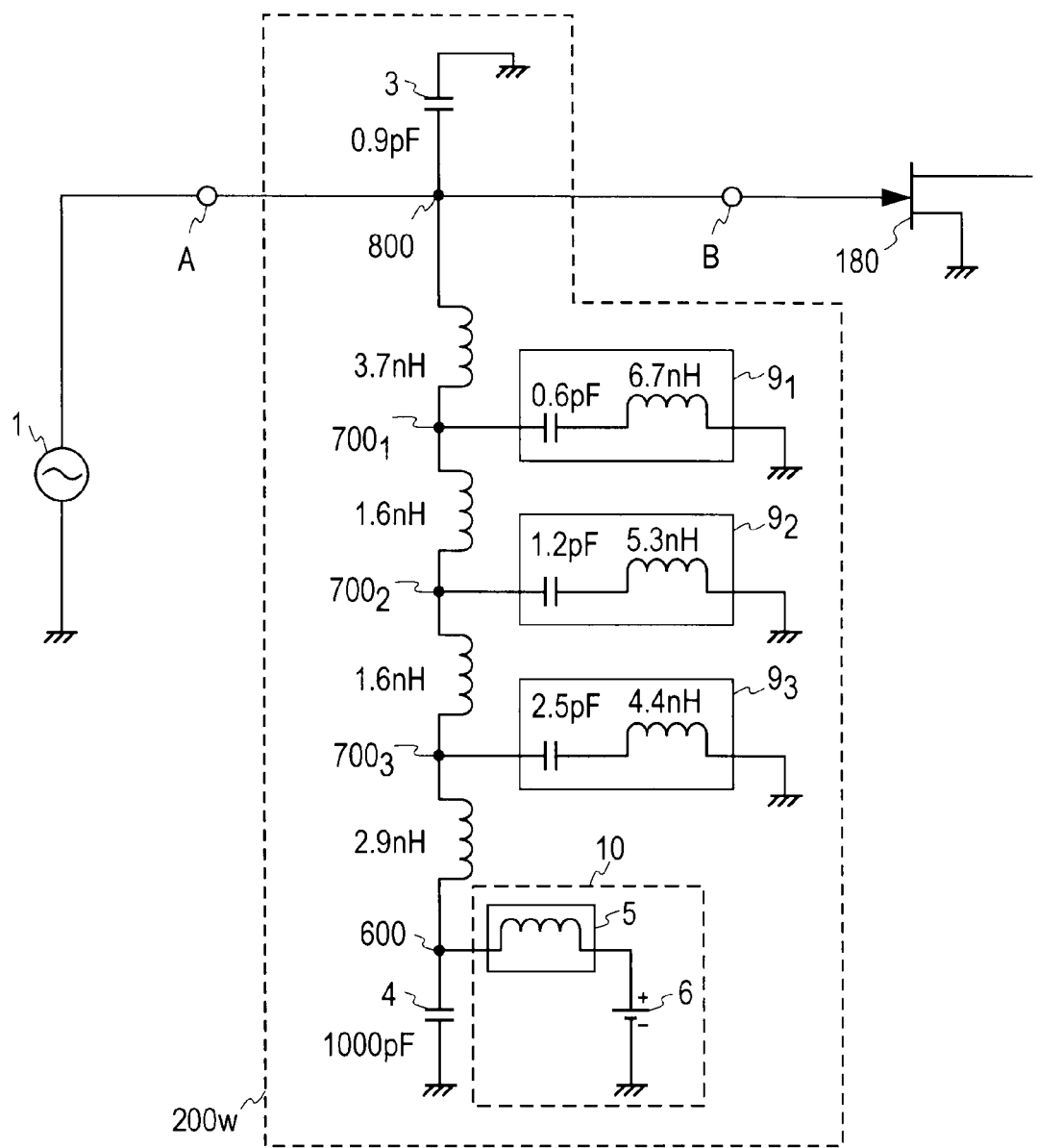
FIG. 6 is a diagram showing a specific example of the bias circuit designed for four bands according to the embodiment in which a first frequency $f_1$=2.5 GHz, a second frequency $f_2$=2 GHz, a third frequency $f_3$=1.5 GHz, and a fourth frequency $f_4$=1 GHz.
Figure 7:
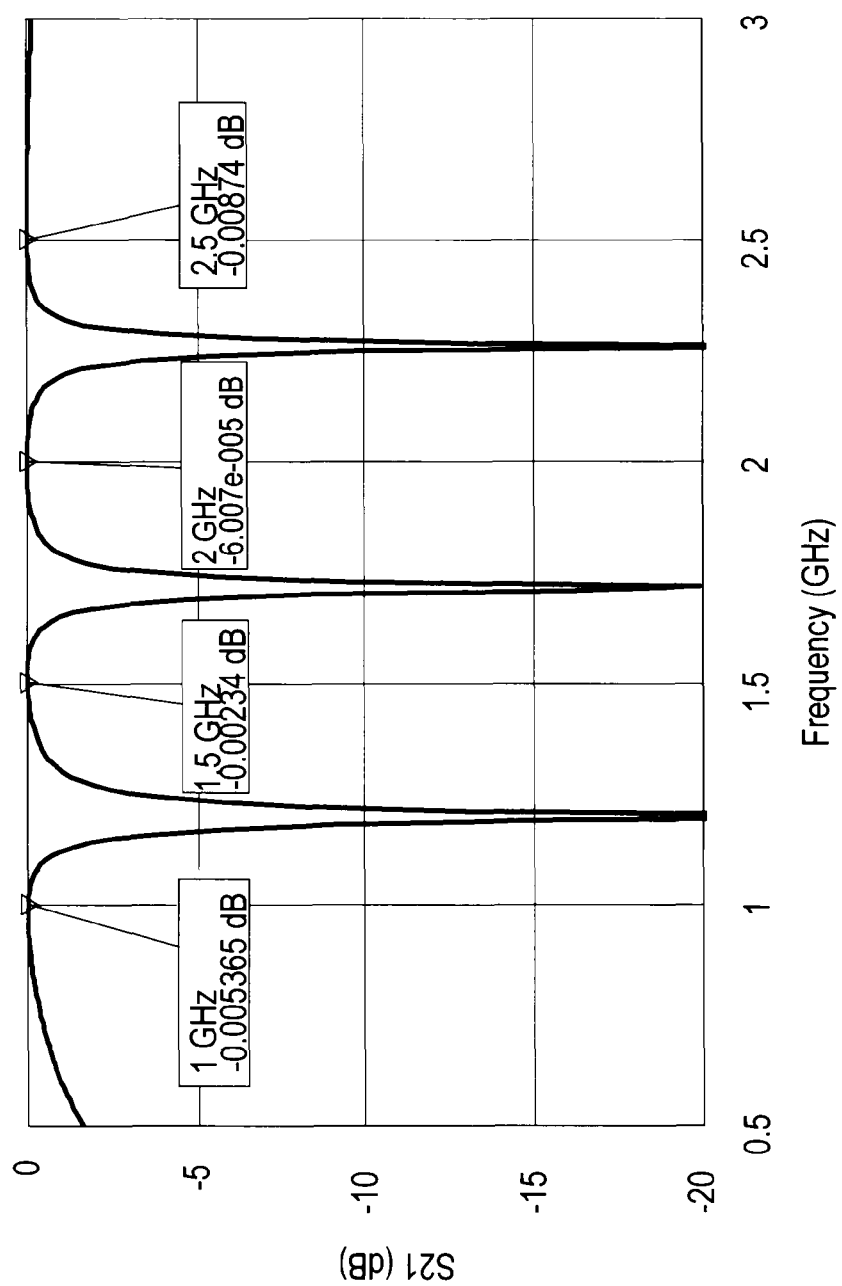
FIG. 7 is a graph showing a result of simulation of pass characteristics (S21) at the first to fourth frequencies of the bias circuit designed for four bands according to the embodiment shown in FIG. 6.

FIG. 6 shows a circuit including a bias circuit 200w, which is the bias circuit 200 in the case of N=4 that is designed to have operating frequencies $f_1$=2.5 GHz, $f_2$=2 GHz, f3=1.5 GHz and $f_4$=1 GHz ($C_p$=0.9 pF, $L_{p1}$=3.7 nH, $L_{p2}$=1.6 nH, $L_{p3}$=1.6 nH, $L_{p2}$=2.9 nH, C=1000 pF, $C_{s1}$=0.6 pF, $L_{s1}$=6.7 nH, $C_{s2}$=1.2 pF, $L_{s2}$=5.3 nH, $C_{s3}$=2.5 pF, $L_{s3}$=4.4 nH). FIG. 7 shows pass characteristics of an AC signal from a port A to a port B in the bias circuit shown in FIG. 6. As can be seen from the drawing, the loss is extremely low at each frequency, and the bias circuit 200w has substantially no effect on the AC signal.

Although the bias circuit according to the present invention can supply a DC voltage and/or a direct current to an active device simultaneously for AC signals in N different frequency bands, the AC signals in the N frequency bands do not always have to flow between the port A and the port B. The bias circuit according to the present invention can supply a DC voltage and/or a direct current even when only AC signals in some of the N frequency bands flow between the port A and the port B.

Figure 8:
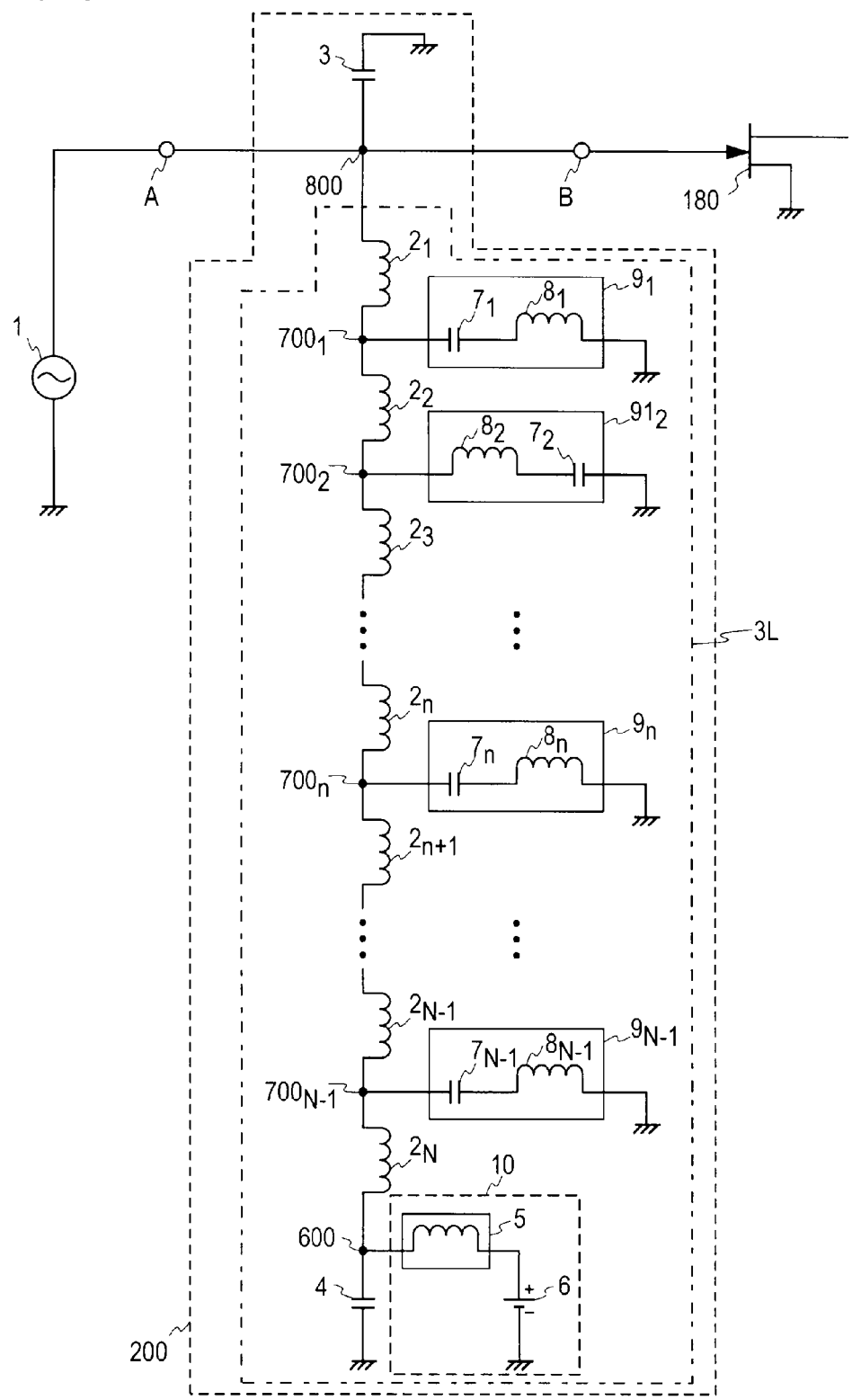
FIG. 8 is a block diagram showing a modification of the bias circuit (designed for N bands) according to the embodiment of the present invention shown in FIG. 5.

In the configurations according to the embodiments described above, the m-th series resonators $9_m$ are shown as including: the m-th resonant capacitor $7_m$ having a capacitance $C_{sm}$ and connected at one end thereof to the connecting point $700_m$; and the m-th inductor $8_m$ having an inductance $L_{sm}$ and connected at one end thereof to the other end of the m-th resonant capacitor $7_m$ and grounded at the other end thereof. However, the present invention is not limited to such configurations. For example, all or some of the N−1 series resonators in the bias circuit 200 may be configured in the same way as a second series resonator $91_2$ shown in FIG. 8 that includes: an m-th resonant inductor $8_m$ having an inductance $L_{sm}$ and connected at one end thereof to the connecting point $700_m$; and an m-th resonant capacitor $7_m$ having a capacitance $C_{sm}$ and connected at one end thereof to the other end of the m-th resonant inductor $8_m$ and grounded at the other end thereof.

The foregoing description of the embodiments of the invention has been presented for the purpose of illustration and description. It is not intended to be exhaustive or to limit the invention to the precise form disclosed. Modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A bias circuit, comprising:
   a bias supply terminal configured to supply a direct-current voltage and/or a direct current to an active device;

a parallel capacitor connected at one end thereof to the bias supply terminal and grounded at the other end thereof; and a parallel circuit connected in parallel with the parallel capacitor and connected at one end thereof to the bias supply terminal, wherein letting N denote a predetermined integer equal to or greater than 2, and m denote each integer equal to or greater than 1 and equal to or smaller than N−1, the parallel circuit comprises:

a direct-current power supply connection terminal connected to a direct-current circuit part including a direct-current power supply;

N series inductors connected in series with each other between the bias supply terminal and the direct-current power supply connection terminal; and N−1 series resonators, an m-th one of the N−1 series resonators from the bias supply terminal side includes an m-th resonant capacitor and an m-th resonant inductor and is connected at one end thereof to a connecting point between an m-th and (m+1)-th ones of the N series inductors from the bias supply terminal side and grounded at the other end thereof, wherein letting n denote an integer equal to or greater than 2 and equal to or smaller than N+1 and letting a resonance frequency of the (n−1)-th series resonator be referred to as an (n−1)-th frequency $f_{n-1}$, for n=2, an inductance of a first one of the N series inductors and a capacitance of the parallel capacitor are set so that a combined admittance of the parallel capacitor and the first one of the N series inductors is zero at a first frequency $f_1$;

for n equal to or greater than 3 and equal to or smaller than N+1, an inductance of each of the resonant inductors and a capacitance of each of the resonant capacitors are set so that a combined admittance of the parallel capacitor, the first to the (n−1)-th series inductors and the first to an (n−2)-th series resonators is zero at the (n−1)-th frequency $f_{n-1}$.

2. The bias circuit according to Claim 1, wherein the inductance of each of the resonant inductors and the capacitance of each of the resonant capacitors are set so that an impedance of each of the first to the m-th series resonators is sufficiently large at an (m+1)-th frequency $f_{m+1}$.

3. The bias circuit according to Claim 1 or 2, wherein $f_1 > f_2 > \ldots > f_{N-1} > f_N$.

* * * * *